United States Patent
Curlee et al.

(10) Patent No.: US 6,351,380 B1
(45) Date of Patent: Feb. 26, 2002

(54) COOLING FAN MOUNTING ARRANGEMENT

(75) Inventors: James Don Curlee, Round Rock; Robert Warren Johnson, Pflugerville, both of TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 09/439,582

(22) Filed: Nov. 12, 1999

(51) Int. Cl.[7] .............................. H05K 7/20; F28F 9/26
(52) U.S. Cl. ..................... 361/695; 361/690; 361/694; 361/718; 165/80.3
(58) Field of Search .................... 361/690, 694, 361/695, 697, 704, 687, 702, 707, 717, 718, 722, 727; 257/718, 719, 722, 727; 174/16.3; 165/80.3, 185

(56) References Cited

U.S. PATENT DOCUMENTS

| | | | |
|---|---|---|---|
| 3,238,835 A | * | 3/1966 | Rosenberg ........................ 85/7 |
| 3,319,918 A | * | 5/1967 | Rapata ........................ 248/239 |
| 4,222,304 A | * | 9/1980 | Yoshida et al. ................ 85/71 |
| 4,286,642 A | * | 9/1981 | Keatley ...................... 411/112 |
| 4,460,534 A | * | 7/1984 | Boehm et al. ............... 264/246 |
| 4,568,243 A | * | 2/1986 | Schubert et al. ........ 415/213 C |
| 4,807,718 A | | 2/1989 | Lotz |
| 5,186,605 A | * | 2/1993 | Tracy ........................ 415/119 |
| 5,208,730 A | * | 5/1993 | Tracy .......................... 361/384 |
| 5,316,423 A | * | 5/1994 | Kin .............................. 411/510 |
| 5,647,713 A | * | 7/1997 | Ge et al. ..................... 411/509 |
| 5,788,566 A | * | 8/1998 | McAnally et al. .......... 454/184 |
| 5,902,276 A | * | 5/1999 | Namey, Jr. .................. 604/218 |
| 5,969,941 A | * | 10/1999 | Cho ............................ 361/687 |
| 6,088,224 A | * | 7/2000 | Gallagher et al. .......... 361/695 |

OTHER PUBLICATIONS

IBM Technical Disclosure Bulletin, No. NB–9,006,197.*
IBM Technical Disclosure Bulletin, No. NN–9,007,233.*

* cited by examiner

Primary Examiner—Leo P. Picard
Assistant Examiner—Anatoly Vortman
(74) Attorney, Agent, or Firm—Russell D. Culbertson; Shaffer & Culbertson, LLP

(57) ABSTRACT

A fan mounting arrangement (10) includes at least one mounting member (14). Each mounting member (14) includes a resilient outer element (19) and an inner element (18) made from a substantially rigid material. The mounting members (14) are all arranged to extend generally parallel to each other. Each mounting member (14) is adapted to be received in a corresponding mounting receptacle (31) associated with a fan housing (11). Once the fan (11) is placed over the mounting members (14) with each mounting member received in its respective mounting receptacle (31), a retaining arrangement retains the fan in the installed position on the mounting members. In this installed position, the resilient elements (19) absorb vibrations from the fan (11) to mechanically isolate the fan from the remainder of the system.

19 Claims, 4 Drawing Sheets

COOLING FAN MOUNTING ARRANGEMENT

TECHNICAL FIELD OF THE INVENTION

This invention relates to cooling fans used in electronic equipment. More particularly, the invention relates to a fan mounting arrangement for simplifying electronic equipment assembly. The invention also encompasses a method of mounting a cooling fan in electronic equipment, and a computer system incorporating the cooling fan mounting arrangement.

BACKGROUND OF THE INVENTION

Computers and many other types of electronic equipment include fans for cooling the equipment or specific components of the equipment. For example, one or more cooling fans are often mounted within the enclosure or chassis of a computer to cool the computer system power supply, microprocessor, hard drives, and other components that generate heat during use.

Cooling fans used in electronic equipment may generate vibrations or oscillations which may be transmitted to other components to produce acoustical noise. This acoustical noise may be particularly troublesome in a personal computer. It is therefore desirable to mount each cooling fan in an arrangement which mechanically isolates the fan. This mechanical isolation prevents vibrations from the fan from being transmitted to other components of the system.

In one prior fan mounting arrangement, resilient mounting members were used to secure the fan housing or shroud to the electronic equipment. Although these prior art mounting members could absorb fan vibrations and mechanically isolate the fan from the other components of the system, their resiliency also made it difficult to install the fan. In particular, the fan mounting procedure using these resilient members required first pulling one end of each mounting member through an opening in the fan housing, and then pulling the opposite end of each mounting member through an opening in the equipment chassis. This fan installation procedure was not only difficult, but also time-consuming.

SUMMARY OF THE INVENTION

It is an object of the invention to provide a cooling fan mounting arrangement which overcomes the above-described problems and others associated with prior cooling fan mounting arrangements. Another object of the invention is to provide a method for mounting a cooling fan in electronic equipment. A further object of the invention is to provide a computer system incorporating the cooling fan mounting arrangement.

A fan mounting arrangement according to the invention includes at least one, and commonly several, mounting members. Each mounting member includes a resilient outer element and an inner element made from a substantially rigid material. These mounting members are all arranged to extend generally parallel to each other. Each mounting member is adapted to be received in a corresponding mounting receptacle associated with a fan housing. Once the fan is placed over the mounting members with each mounting member received in its respective mounting receptacle, a retaining arrangement retains the fan in the installed position on the mounting members. In this installed position, the resilient elements absorb vibrations from the fan to mechanically isolate the fan from the remainder of the system.

In the preferred mounting arrangement, the mounting members are associated with a separate fan mounting bracket which is itself connected to the electronic equipment in which the fan is to be secured. The bracket may be connected to the electronic equipment in any suitable fashion. Both the mounting bracket and inner element of each mounting member may be molded from a single hard or rigid plastic material. The resilient outer element of each mounting member may be molded from a suitable resilient plastic or rubber material. In the preferred form of the invention, the bracket and mounting members are molded together in a two-shot molding process. The resilient elements of the mounting members are thus molded in place on the relatively large bracket and need not be secured to the bracket as a separate assembly step.

The fan mounting arrangement according to the invention has several advantages over prior cooling fan mounting arrangements. First, the inner element of each mounting member supports the respective resilient element so that each mounting member may be easily pushed through the respective mounting receptacle associated with the fan. No special tools or installation techniques are required to install the fan on the mounting members. Yet the resilient material associated with the mounting members provides the desired mechanical isolation and vibration dampening. Another significant advantage of the present mounting arrangement is that the entire arrangement, including the mounting bracket and mounting members, may be molded in a two-shot molding process to provide a single part. This production technique obviates the need to connect the resilient elements of the mounting arrangement to the rigid components, and thus reduces assembly time.

These and other objects, advantages, and features of the invention will be apparent from the following description of the preferred embodiments, considered along with the accompanying drawings.

DESCRIPTION OF THE PREFERRED EMBODIMENTS

Figure 1:
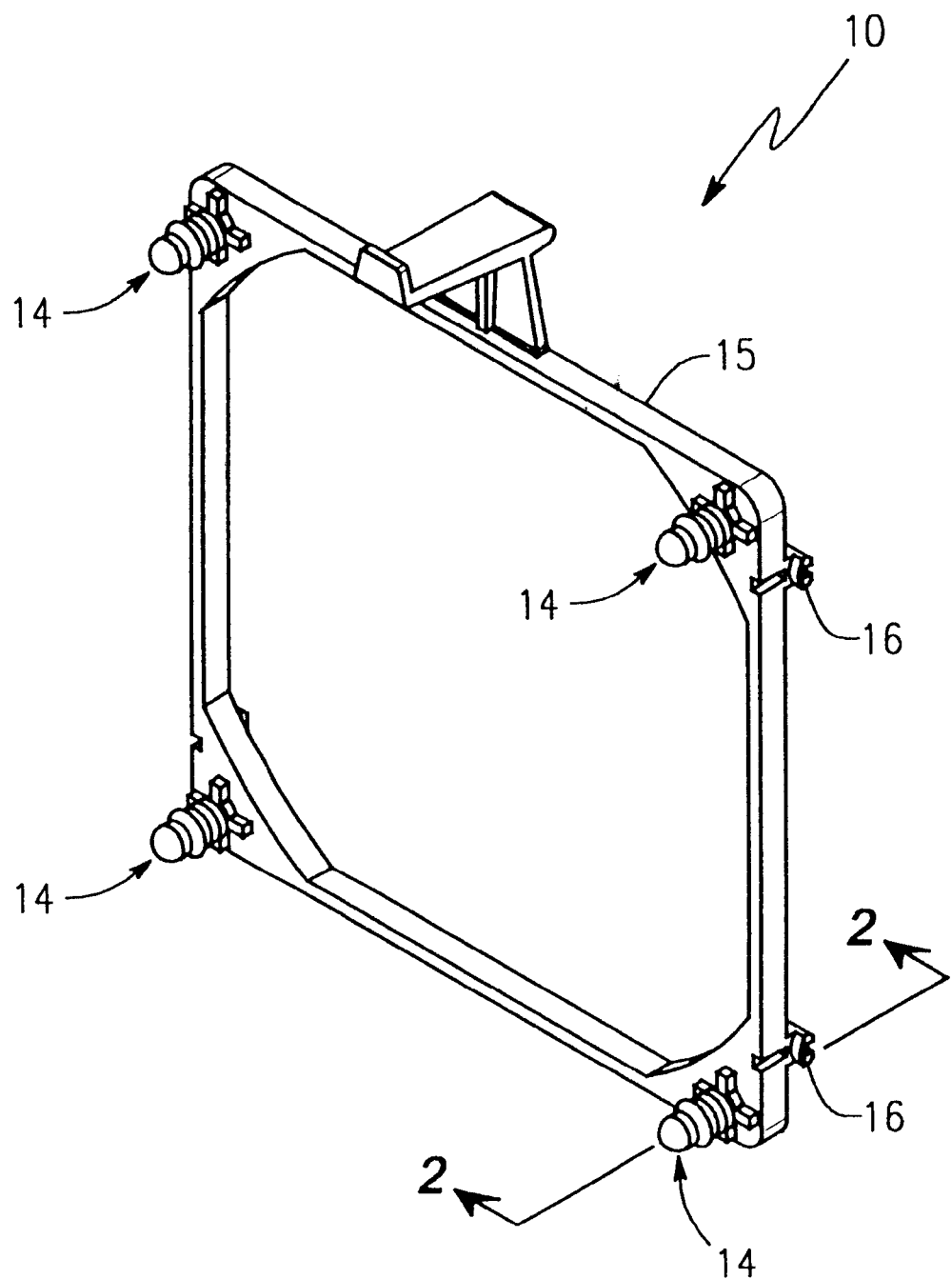
FIG. 1 is a view in perspective of a fan mounting bracket embodying the principles of the invention.
Figure 2:
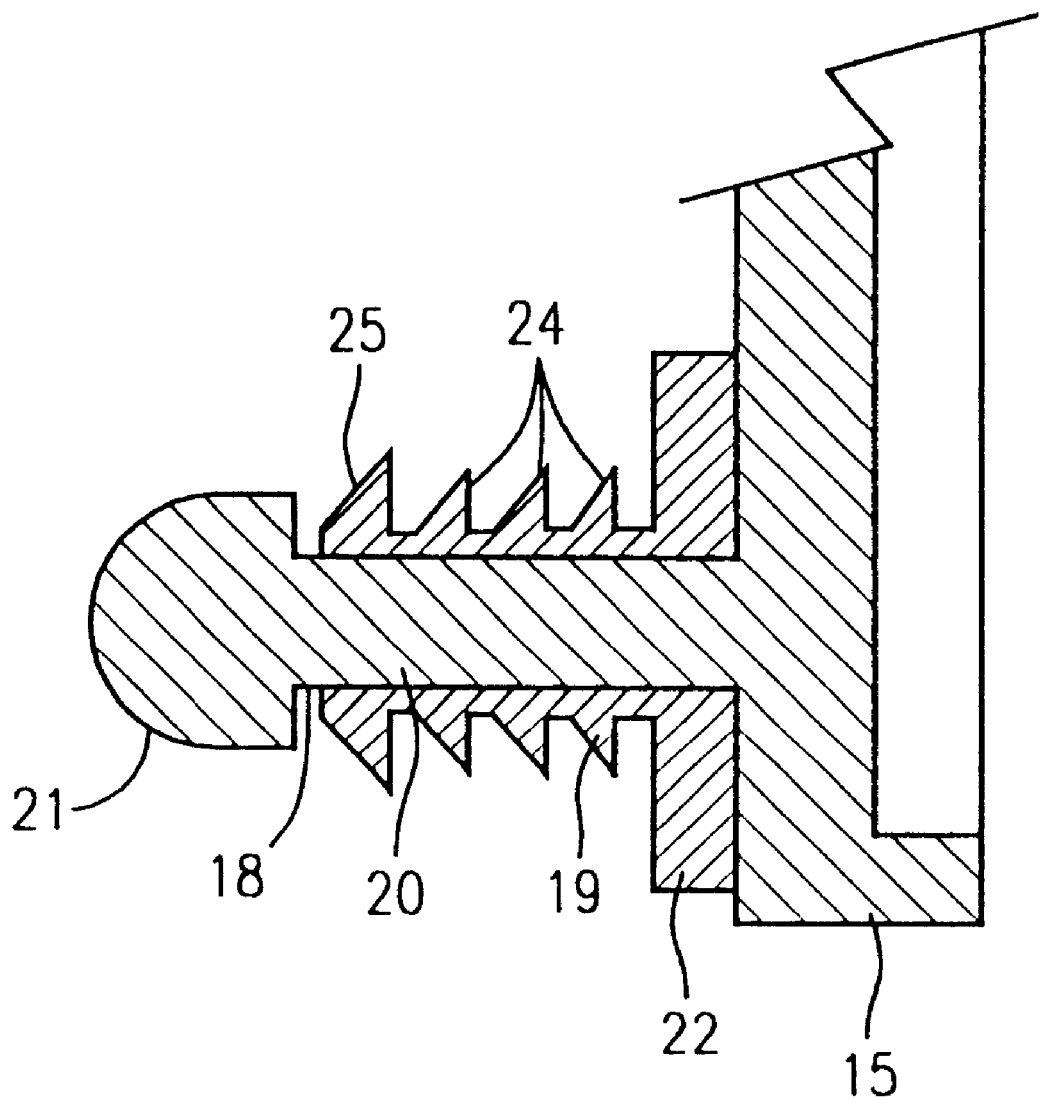
FIG. 2 is a view in section taken along line 2—2 in FIG. 1, through one of the mounting members.
Figure 3:
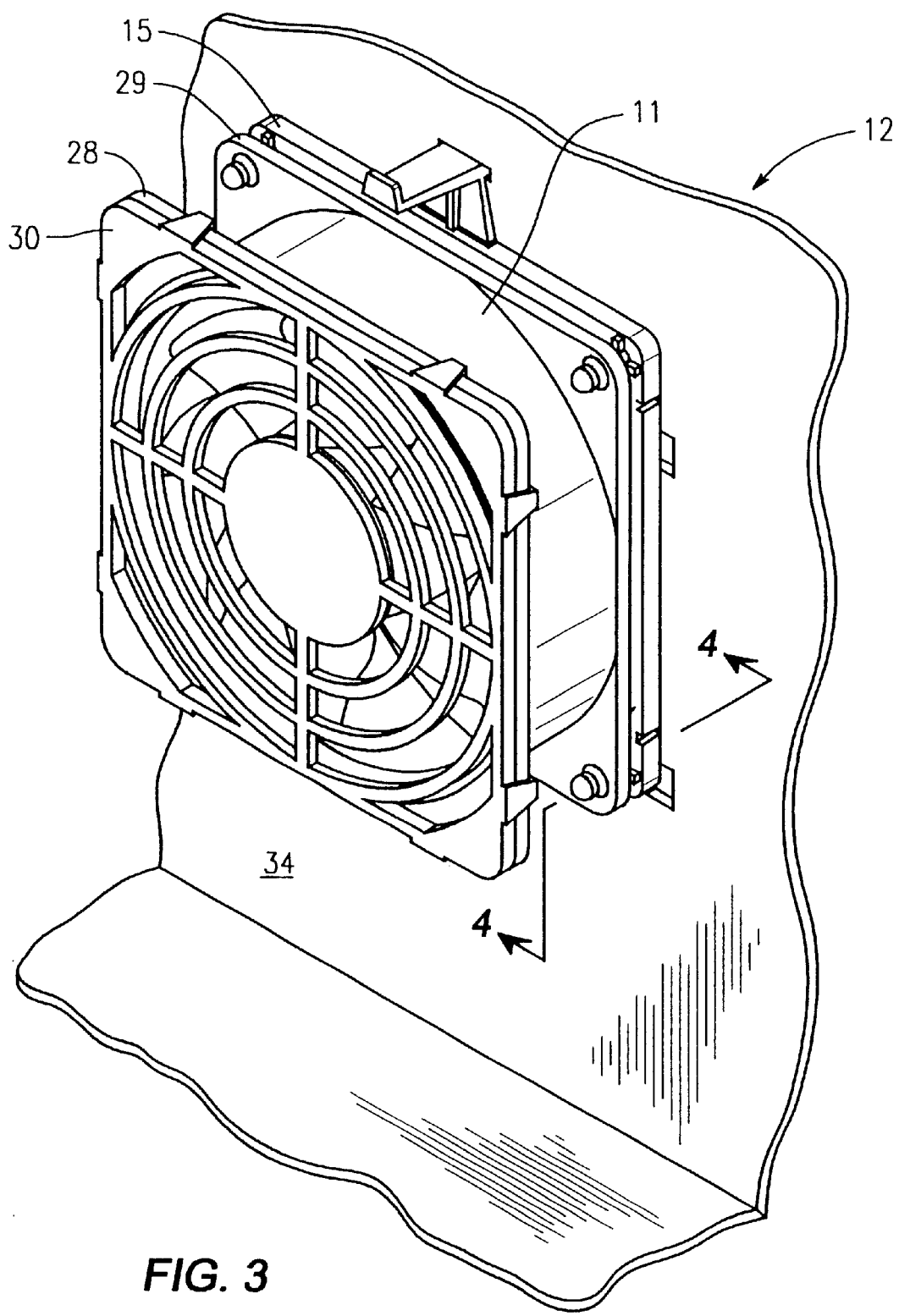
FIG. 3 is a view in perspective showing a fan secured to a computer chassis using the mounting bracket shown FIG. 1.
Figure 4:
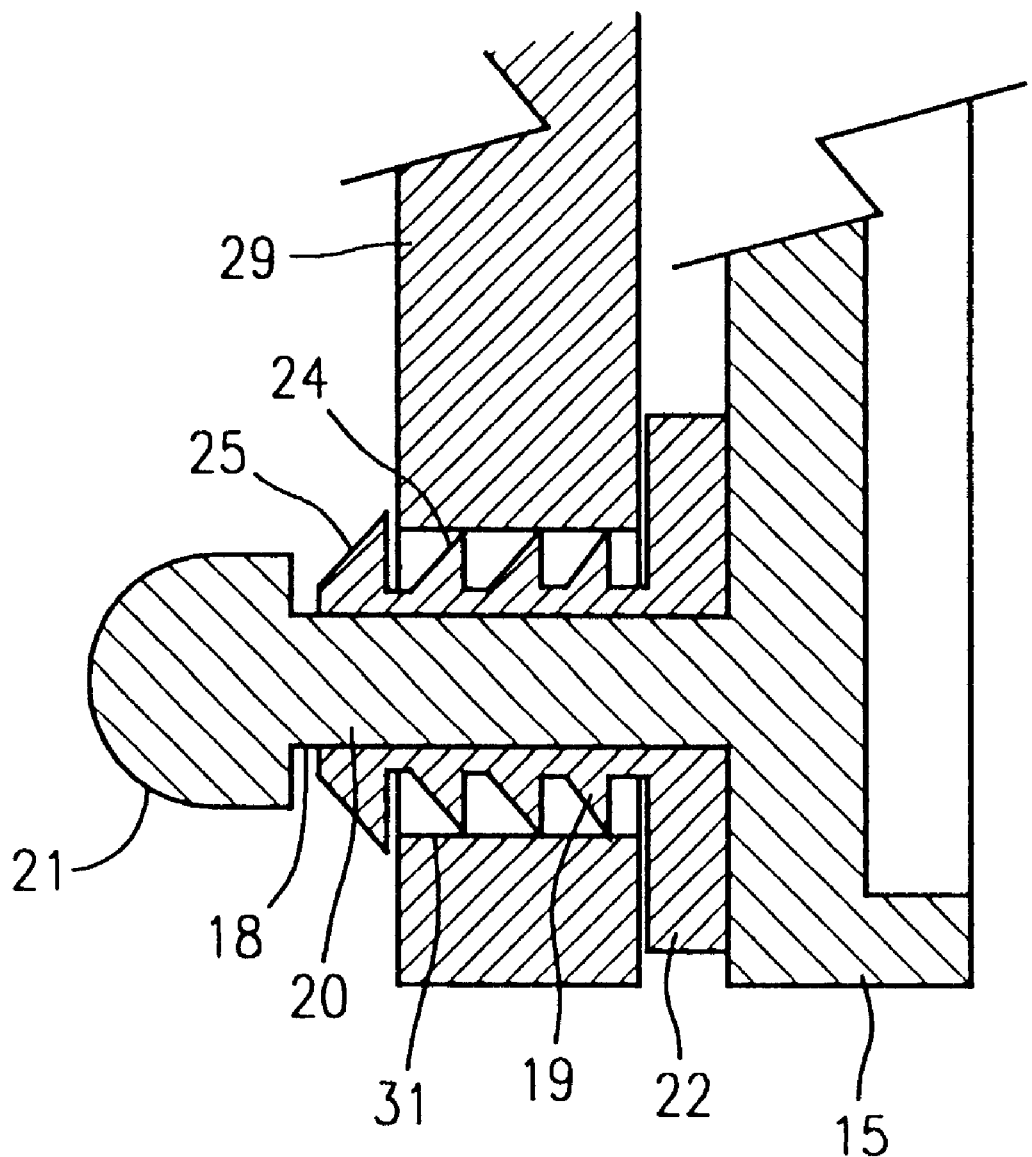
FIG. 4 is view in section take along line 4—4 in FIG. 3, showing a mounting member received in a mounting receptacle.

FIGS. 1 and 2 illustrate one preferred fan mounting arrangement 10 embodying the principles of the invention. FIGS. 3 and 4 show the mounting arrangement 10 securing a fan 11 to a computer chassis 12. It will be appreciated that the computer chassis 12 and fan 11 shown in FIGS. 3 and 4 are shown only for purposes of example. Fan mounting arrangements falling within the scope of the present invention and the accompanying claims may be used with many other types of electronic equipment and with other fans.

Referring to FIGS. 1 and 2, mounting arrangement 10 includes at least one mounting member 14. The illustrated embodiment includes four identical mounting members 14. Each mounting member 14 is connected to a fan mounting bracket 15. Fan mounting bracket 15 is adapted to be connected by connectors 16 to computer chassis 12, as will be described below with reference to FIG. 3.

Each mounting member 14 includes a substantially rigid inner element 18 and a resilient outer element 19. Inner element 18 includes an elongated base section 20 and an enlarged end section 21, both preferably formed from a suitable hard plastic material. The resilient element 19 of each mounting member 14 is formed from a suitable resilient plastic or rubber material. The preferred resilient element 19 also includes a base 22 and a series of circumferential ridges 24. As will be described below with reference to FIG. 3, ridges 24 frictionally engage the fan structure to retain fan 11 in the desired mounted position and also help to mechanically isolate the fan from the chassis 12.

The inner element 18 of each mounting member 14 is preferably molded together with bracket 15. Resilient elements 19 are also preferably molded together with bracket 15 and inner elements 18 in a two-shot molding process. This two-shot molding process results in a unitary fan mounting arrangement 10 and eliminates the need to connect the various components of the mounting arrangement in separate assembly steps. Alternatively, bracket 15, inner elements 18, and resilient elements 19 may be formed separately and later assembled into the fan mounting device shown in FIGS. 1 and 2. Of course, the unitary product is preferred since it eliminates both parts and assembly steps.

Referring now to FIGS. 3 and 4, fan mounting bracket 15 is specifically adapted to secure fan 11 to computer chassis 12. Fan 11 is secured to bracket 15 as described in detail below, and the bracket is connected to chassis 12. The connection between bracket 15 and chassis 12 may be made in any suitable fashion. For example, connectors 16 may extend into slots or openings (not shown) formed in chassis wall 34.

Fan 11 includes a first flange 28 and a second flange 29. First flange 28 is adapted to receive a finger guard 30, while second flange 29 includes a mounting receptacle or opening 31 for each mounting member 14 included in the fan mounting arrangement 10. It will be appreciated that the particular fan structure shown in FIGS. 3 and 4 is shown only for purposes of example, and is not intended to limit the invention. Generally, the only requirement of a fan structure for use with the present invention is that the structure should include a mounting receptacle for each mounting member 14.

Fan 11 is secured to bracket 15 by first aligning mounting members 14 with mounting receptacles 31, and then inserting each mounting member into the respective receptacle. FIG. 4 shows a mounting member 14 received in a receptacle 31. The other mounting members 14 are received similarly in their respective receptacle 31. In the received position shown in FIG. 4, the outer surface of the resilient element 19 frictionally engages the inner wall of the respective receptacle 31. This frictional engagement retains mounting member 14 in the respective receptacle 31, and thus retains fan 11 in place on the fan mounting arrangement 10. Ridges 24 help enhance this frictional engagement. Each ridge 24 preferably has a maximum external dimension larger than the internal dimension of the respective receptacle 31. Thus, ridges 24 are somewhat deformed at their periphery to fit into the respective receptacle 31.

It will be noted that each ridge 24 need not have the same maximum external dimension in a given one of the resilient elements 19. In particular, outermost ridge 25 shown in FIGS. 2 and 4 has a maximum external dimension somewhat larger than ridges 24. As shown in FIG. 4, outermost ridge 25 extends over the outer edge of receptacle 31 to help retain fan 11 in place. Also, although the circumferential ridges 24 are preferred, each resilient element 19 may be cylindrical, include longitudinal ridges, or have any other shape which provides the desired frictional engagement with the wall of receptacle 31. Regardless of the external shape of the resilient elements 19 or the manner of frictional engagement with receptacles 31, the resilient material of elements 19 absorbs vibrations emanating from fan 11 to mechanically isolate the fan from chassis 12. Ridge structures such as ridges 24 provide even more flexibility and generally absorb vibrations better than a resilient element of the same material which engages the receptacle along the entire receptacle surface.

Four mounting members 14 cooperate with four receptacles 31 in the illustrated form of the invention. Although these four mounting points are convenient for mounting fan 11 with rectangular flange 29, more or fewer mounting members may be used within the scope of the invention. For example, a centrally located single mounting member could be used to mount a fan according to the invention.

The function of enlarged end section 21 of each inner element 18 will be appreciated from the view shown in FIG. 4. Although resilient element 19 is preferably molded in place on inner element 18, it may still be possible for the resilient element to slide axially along the inner element. End section 21 prevents any such axial movement. Alternative arrangements for preventing this axial movement may include a tapered or circumferentially ridged inner element 18.

The illustrated preferred form of the invention places mounting members 14 on bracket 15 and mounting receptacles 31 on a structure associated with fan 11. However, alternate forms of the invention may reverse this placement. In this alternate arrangement, mounting members similar to those shown at reference numeral 14 would be formed on, or otherwise associated with, the fan structure. The mounting members would be adapted to be received in mounting receptacles similar to receptacles 31, but either formed in chassis 12 or associated with some structure connected to chassis 12.

The above described preferred embodiments are intended to illustrate the principles of the invention, but not to limit the scope of the invention. Various other embodiments and modifications to these preferred embodiments may be made by those skilled in the art without departing from the scope of the following claims. For example, the illustrated mounting members 14 could be connected directly to chassis 12 rather than indirectly through bracket 15. In some forms of the invention, mounting members 14 may even be formed integrally with the chassis.

What is claimed is:

1. A mounting arrangement for securing a fan to a second structure associated with electronic equipment, one of the fan and second structure having at least one mounting receptacle, the mounting arrangement comprising:

(a) a mounting member for each mounting receptacle, each mounting member having a substantially rigid inner element and a resilient outer element positioned over the respective inner element, each mounting member also being adapted to be connected to the other of said one of the fan and second structure having at least one mounting receptacle, and each mounting member having a size and shape so as to be insertable as a unit into the respective mounting receptacle to a received position in which the respective resilient outer element frictionally engages an inner surface of the respective mounting receptacle; and (b) a plurality of external ridges on each respective resilient outer element, the external dimension of each ridge being greater than the internal dimension of the respective mounting receptacle in which the respective mounting member is to be received, and the plurality of external ridges being located on the respective resilient outer element so as to be positioned within the respective mounting receptacle when the respective mounting member is in the received position.

2. The mounting arrangement of claim 1 wherein each mounting receptacle is associated with the fan and each mounting member is connected to the second structure.

3. The mounting arrangement of claim 2 further comprising:

(a) a mounting bracket to which each mounting member is connected; and (b) a bracket connector arrangement associated with the mounting bracket for connecting the mounting bracket to the second structure.

4. The mounting arrangement of claim 1 wherein each inner element comprises:

(a) an elongated base section; and (b) an enlarged end section.

5. The mounting arrangement of claim 4 wherein the elongated base section and enlarged end section of each inner element are integrally formed.

6. The mounting arrangement of claim 4 wherein each resilient outer element comprises a resilient sleeve secured over the elongated base section of the respective inner element.

7. The mounting arrangement of claim 1 wherein each mounting member is formed in a two-shot molding process with each respective resilient outer element being molded over the respective inner element.

8. The mounting arrangement of claim 1 wherein each resilient outer element includes an outermost external ridge having an external dimension larger than that of the other external ridges of the respective resilient outer element, the outermost external ridge being positioned at a distal end of the respective resilient outer element which resides outside of the respective mounting receptacle when the respective mounting member is in the received position in said mounting receptacle.

9. A computer system including:

(a) a system chassis;

(b) a fan mounting bracket connected to the system chassis;

(c) a fan having at least one mounting receptacle;

(d) an elongated mounting member for each mounting receptacle included with the fan, each mounting member being received through the respective mounting receptacle and having a substantially rigid inner element with a maximum transverse external dimension smaller than a minimum transverse inner dimension of the respective mounting receptacle, each rigid inner element extending from a first side of the fan mounting bracket with a resilient outer element positioned over the respective rigid inner element; and (e) a retainer arrangement for at least one mounting member, each respective retainer arrangement for retaining the respective mounting member in the respective fan mounting receptacle through which it is received.

10. The computer system of claim 9 wherein each inner element comprises:

(a) an elongated base section; and (b) an enlarged end section integrally formed with the elongated base section.

11. The computer system of claim 10 wherein each resilient outer element comprises a resilient sleeve positioned over the elongated base section of the respective inner element.

12. The computer system of claim 9 wherein each retainer arrangement comprises:

(a) a frictional engagement between an outer surface of the respective resilient outer element and an inner surface of the respective mounting receptacle.

13. The computer system of claim 9 wherein each retainer arrangement includes:

(a) a plurality of external ridges located on the respective resilient outer element and positioned within the respective fan mounting receptacle through which the respective mounting member is received, so as to frictionally engage the surface of said fan mounting receptacle.

14. The computer system of claim 13 wherein the retainer arrangement further includes an outermost external ridge on the respective resilient outer element, the outermost external ridge having a minimum transverse external dimension larger than the maximum transverse internal dimension of the respective fan mounting receptacle, and being positioned at a distal end of the respective resilient outer element which resides outside of the respective mounting receptacle in which the respective mounting member is received.

15. The computer system of claim 9 wherein each mounting member is formed in a two-shot molding process with each respective resilient outer element being molded over the respective inner element.

16. A method of securing a fan for cooling electrical components, the method comprising the steps of:

(a) supporting each of a plurality of resilient elements with a separate substantially rigid inner element, each inner element extending from a structure to which the fan is to be secured;

(b) with each resilient element supported on the respective rigid inner element, inserting each of the plurality of resilient elements through a separate mounting receptacle formed in a structure associated with the fan; and (c) frictionally engaging an inner surface of each mounting receptacle with an outer surface of the respective resilient element received therein.

17. The method of claim 16 wherein each respective resilient element is positioned over a base section of the respective inner element and including the step of:

(a) retaining the respective resilient element on the respective inner element with an enlarged end portion of the respective inner element.

18. The method of claim 17 wherein each inner element is integrally formed with a mounting bracket and the method includes the step of:

(a) securing the mounting bracket to the structure on which the fan is to be mounted.

19. The method of claim 16 wherein each resilient element and each inner element are molded from suitable plastic materials and each resilient element is molded with the respective inner element in a two-shot molding process.

* * * * *